(12) United States Patent
Wang et al.

(10) Patent No.: US 7,268,362 B2
(45) Date of Patent: Sep. 11, 2007

(54) HIGH PERFORMANCE TRANSISTORS WITH SIGE STRAIN

(75) Inventors: Chih-Hao Wang, Hsin-Chu (TW); Ta-Wei Wang, Taipei (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 329 days.

(21) Appl. No.: 11/066,062

(22) Filed: Feb. 25, 2005

(65) Prior Publication Data
US 2006/0194387 A1  Aug. 31, 2006

(51) Int. Cl.
H01L 29/06 (2006.01)
(52) U.S. Cl. .................... 257/20; 257/12; 257/E21.403; 438/285
(58) Field of Classification Search ............ 257/12–20, 257/623
See application file for complete search history.

(56) References Cited

U.S. PATENT DOCUMENTS

| | | | |
|---|---|---|---|
| 5,357,119 A * | 10/1994 | Wang et al. .................. 257/18 |
| 6,498,359 B2 * | 12/2002 | Schmidt et al. ............. 257/190 |
| 6,730,551 B2 | 5/2004 | Lee et al. |
| 6,765,227 B1 * | 7/2004 | Yu et al. ....................... 257/19 |
| 6,825,529 B2 | 11/2004 | Chidambarrao et al. |
| 6,881,635 B1 * | 4/2005 | Chidambarrao et al. .... 438/300 |
| 7,071,119 B2 * | 7/2006 | Mears et al. ................ 438/761 |
| 2003/0227072 A1 | 12/2003 | Forbes et al. |
| 2004/0147079 A1 | 7/2004 | Forbes et al. |
| 2004/0175872 A1 | 9/2004 | Yeo et al. |
| 2005/0093084 A1 * | 5/2005 | Wang et al. ................. 257/410 |
| 2005/0095795 A1 * | 5/2005 | Son et al. ................... 438/300 |
| 2005/0156238 A1 * | 7/2005 | Wen et al. .................. 257/347 |
| 2006/0128105 A1 * | 6/2006 | Ouyang et al. ............. 438/300 |
| 2006/0163672 A1 * | 7/2006 | Wang et al. ................ 257/396 |

OTHER PUBLICATIONS

Ge, C.-H., et al., "Process-Strained Si (PSS) CMOS Technology Featuring 3D Strain Engineering," IEEE (2003) 4 pages.
Ghani, T., et al., "A 90nm High Volume Manufacturing Logic Technology Featuring Novel 45nm Gate Length Strained Silicon CMOS Transistors," IEDM (2003) pp. 978-980.
Ismail, K., et al., "Electron Transport Properties Si/SiGe Heterostructures: Measurements and Device Implications," Applied Physics Letters, vol. 63, No. 5 (Aug. 2, 1993) pp. 660-662.
Nayak, D.K., et al., "Enhancement-Mode Quantum -Well $Ge_xSi_{1-x}$ PMOS," IEEE Electron Device Letters, vol. 12, No. 4 (Apr. 1991) pp. 154-156.
Yeo, Y-C., et al., "Enhanced Performance in Sub-100 nm CMOSFETs Using Strained Epitaxial Silicon-Germanium," IEDM (2000) pp. 753-756.
Yin, H., et al., "Full-Depleted Strained-Si on Insulator NMOSFETs Without Relaxed SiGe Buffers," IEDM (2003) pp. 53-56.

* cited by examiner

Primary Examiner—Jerome Jackson
Assistant Examiner—Paul Budd
(74) Attorney, Agent, or Firm—Slater & Matsil, L.L.P.

(57) ABSTRACT

A preferred embodiment of the invention comprises a semiconductor device having stress in the source/drain channel. The device comprises a substrate having a lattice constant greater than or equal to silicon and a first layer on the substrate, wherein the first layer has a lattice constant greater than the substrate. Alternative embodiments include a second layer formed on the first layer. The second layer has a lattice constant less than the first layer. Preferably, the second layer underlies a gate electrode and at least a portion of a sidewall spacer. Still other embodiments include a recess for inducing stress in the source/drain channel.

22 Claims, 5 Drawing Sheets

HIGH PERFORMANCE TRANSISTORS WITH SIGE STRAIN

TECHNICAL FIELD

This invention relates generally to semiconductors, and more specifically to CMOS devices with strained channel regions.

BACKGROUND

The scaling of VLSI circuits is a constant effort. With circuits becoming smaller and faster, device driving current improvement becomes more important. Device current is closely related to gate length, gate capacitance, and carrier mobility. Shortening poly-gate length, increasing gate capacitance and increasing carrier mobility can improve the device current performance. Gate length reduction is an on-going effort in order to shrink circuit size. Increasing gate capacitance has also been achieved by efforts such as reducing gate dielectric thickness, increasing gate dielectric constant, and the like. In order to further improve device current, enhancing carrier mobility has also been explored.

Among efforts made to enhance carrier mobility, forming a strained silicon channel is a known practice. Strain can enhance bulk electron and hole mobility. The performance of a MOS device can be enhanced through a strained-surface channel. This technique allows performance to be improved at a constant gate length, without adding complexity to circuit fabrication or design.

When silicon is placed under strain, the in-plane, room temperature electron mobility is dramatically increased. One way to develop strain is by using a graded SiGe epitaxy layer as a substrate on which a layer of relaxed SiGe is formed. A layer of silicon is formed on the relaxed SiGe layer. MOS devices are then formed on the silicon layer, which has inherent strain. Since the lattice constant of SiGe is larger than that of Si, the Si film is under biaxial tension and thus the carriers exhibit strain-enhanced mobility.

Strain in a device may have components in three directions; parallel to the MOS device channel length, parallel to the device channel width, and perpendicular to the channel plane. The strains parallel to the device channel length and width are called in-plane strains. Research has revealed that bi-axial, in-plane tensile strain can improve NMOS performance, and compressive strain parallel to the channel length direction can improve PMOS device performance.

What is needed then, are methods for improving device performance by promoting tensile strain in NMOS devices and compressive strain in PMOS devices.

SUMMARY OF THE INVENTION

These and other problems are generally solved or circumvented, and technical advantages are generally achieved by preferred embodiments of the present invention that provide high performance transistors with SiGe strain.

A preferred embodiment of the invention provides a semiconductor device. The device comprises a substrate, wherein the substrate has a lattice constant greater than or equal to silicon and a first layer on the substrate, wherein the first layer has a lattice constant greater than the substrate. Embodiments may further include a gate above the first layer, the gate comprising a gate electrode and a gate dielectric underlying the gate electrode. Embodiments further include a spacer. Preferably, the spacer is formed on a sidewall of the gate electrode, a sidewall of the gate dielectric, and a portion of a top surface of the first layer.

Alternative embodiments include a second layer formed on the first layer. The second layer comprises a top surface, a bottom surface, and a lateral surface connecting the top surface and the bottom surface. The second layer further comprises a material having a lattice constant less than the first layer. Preferably, the second layer underlies the gate electrode and at least a portion of the spacer, and wherein substantially all the lateral surface and all the bottom surface of the second layer contact the first layer. In other embodiments, the top surface of the second layer contacts the first layer whereby the first layer fully encapsulates the second layer.

Still other embodiments of the invention provide a structure for inducing stress in a source/drain channel of a metal oxide semiconductor MOS device. Embodiments include a substrate having a lattice constant and an optional buffer layer on the substrate, wherein the buffer layer has a lattice constant greater than or equal to the substrate lattice constant. Alternate embodiments include an optional capping layer on the substrate, wherein the capping layer has a lattice constant less than or equal to the buffer layer lattice constant. Alternate embodiments include a gate on the capping layer, wherein the gate includes a gate dielectric on the capping layer, and a gate electrode on the gate dielectric. Preferably, a spacer is formed on a sidewall of the gate electrode, on a sidewall of the gate dielectric, and within a recess in the capping layer. Preferably, a stressor is formed within a portion of the spacer within the recess in the capping layer, wherein the stressor includes a semiconductor material having a lattice constant greater than the substrate lattice constant. Embodiments may include a source/drain region substantially aligned with the spacer.

The capping layer may include silicon, germanium, carbon, and combinations thereof. The buffer layer may include silicon, germanium, carbon, and combinations thereof. The stressor may include silicon, germanium, carbon, and combinations thereof.

In alternate embodiments, the buffer layer comprises a first buffer layer portion having a first buffer thickness and a second buffer layer portion having a second buffer thickness. Preferably, the second buffer thickness is less than or equal to the first buffer thickness, and the first buffer layer portion underlies the gate and the spacer. Preferably, the second buffer layer portion is adjacent the gate and the spacer. Preferably, the difference between the first buffer thickness and the second buffer thickness is less than about 80 nm.

In alternate embodiments, the capping layer further comprises a first capping layer portion having a first capping thickness and a second capping layer portion having a second capping thickness. Preferably, the second capping thickness is less than or equal to the first capping thickness. Preferably, the first capping layer portion underlies the gate and the second capping layer portion underlies the stressor. Preferably, the difference between the first capping thickness and the second capping thickness is less than about 40 nm.

Alternate embodiments may dispense with the optional capping layer or the optional buffer layer. In one embodiment, both layers are dispensed with. In an alternate embodiment the substrate further comprises a first substrate portion having a first substrate thickness and a second substrate portion having a second substrate thickness. Preferably, the second substrate thickness is less than or equal to the first substrate thickness. Preferably, the first substrate portion underlies the gate and the spacer, and the second substrate portion is adjacent the gate and the spacer.

Additional features and advantages of embodiments of the invention will be described hereinafter, which form the subject of the claims of the invention. It should be appreciated by those skilled in the art that the specific embodiments disclosed might be readily utilized as a basis for modifying or designing other structures or processes for carrying out the purposes of the present invention. It should also be realized by those skilled in the art that such equivalent constructions and variations on the example embodiments described do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The intermediated stages of manufacturing a preferred embodiment of the present invention are illustrated. Throughout the various views and illustrative embodiments of the present invention, and to more clearly illustrate certain embodiments, a letter indicating variations of the same structure, material, or process step may follow a figure number.

Figure 1A:
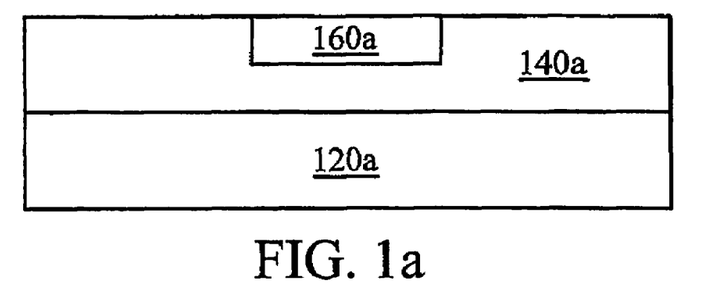
FIGS. 1a to 1c are cross-sectional views of intermediate stages in the manufacture of PMOS devices according to embodiments of the present invention.
Figure 1B:
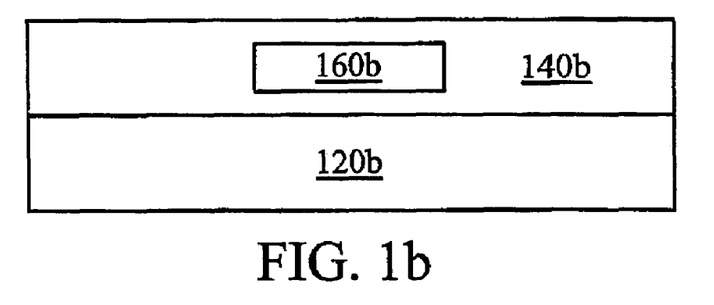
Figure 1C:
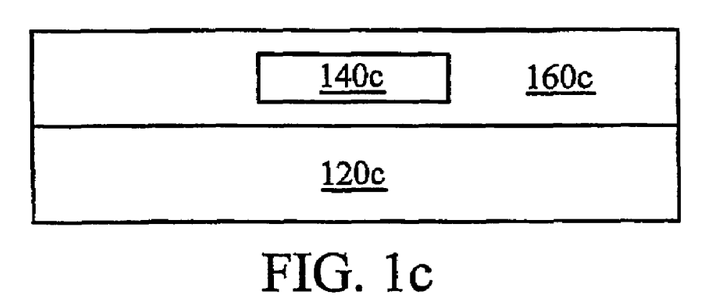

FIGS. 1a through 1c illustrate the first three embodiments of the invention, which are preferred for PMOS devices. Briefly, all three embodiments in FIGS. 1a to 1c are comprised of a substrate 120, a first layer 140, and a second layer 160. Embodiments in FIGS. 1a to 1c share the following relationship: the lattice constant of the first layer 140 is greater than or equal to the lattice constant of the substrate 120 and the lattice constant of the second layer 160 is less than the lattice constant of the first layer 140. In the first three embodiments, the preferred materials are as follows: the substrate 120 is preferably silicon, the first layer 140 is preferably SiGe, and the second layer 160 is preferably silicon.

Turning now to FIG. 1a. FIG. 1a illustrates stacked layers 120a, 140a, and 160a. Substrate 120a is preferably a semiconductor, and preferably silicon. Substrate 120a may comprise a silicon wafer or a layer of silicon formed on an insulating layer such as a buried oxide layer (BOX), in the well-known silicon-on-insulator (SOI) structure.

The first layer 140a is formed over the substrate 120a using a conventional patterning/epitaxy sequence. The first layer 140a is preferably a semiconductor having a lattice constant greater than or equal to the lattice constant of the substrate 120a. In the first preferred embodiment, the first layer 140a comprises SiGe. In alternative embodiments, the first layer 140a may comprise Si, Ge, or C, depending on the materials used in the substrate 120a. The preferred thickness of the first layer 140a is between about 1 to 80 nm.

Continuing with FIG. 1a, a recessed feature is formed in the surface of the first layer 140a. The recessed feature is filled with a material having a lattice constant less than the lattice constant of the first layer 104a. For each illustration of the various embodiments, the material having a lattice constant less than the lattice constant of the first layer 104a and filling the recessed feature is referred to herein as a second layer 160a, as shown in FIG. 1a. The second layer 160a is preferably between about 1 to 75 nm thick. According to the first preferred embodiment illustrated in FIG. 1a, all but one side or surface of the second layer 160a is fully surrounded by the first layer 140a.

Turning now to FIG. 1b, there is shown the structure of FIG. 1a subjected to further processing. Specifically, a silicon epitaxy layer is formed on the first layer 140a and second layer 160a of FIG. 1a. This results in the structure of FIG. 1b; wherein the second layer 160b of FIG. 1b is fully surrounded on all sides (encapsulated) by the first layer 140b.

In FIG. 1c, the relative positions of the first layer (large lattice) and the second layer (small lattice) of FIG. 1b are inverted. Specifically, FIG. 1c comprises a substrate 120e, preferably silicon, a first layer 160c, and a second layer 140c that is fully encapsulated by the first layer 160c. Unlike the embodiment of FIG. 1b, however, in the embodiment of FIG. 1c, the second layer 140c has a lattice constant larger than the substrate, and the lattice constant of the first layer 160c is less than the lattice constant of the second layer 140c. In the embodiment illustrated by the FIG. 1c configuration, the substrate 120c and the first layer 160c may comprise the same material, preferably silicon. Preferably, the first layer 160c (silicon) is formed using an epitaxy process.

Figure 2A:
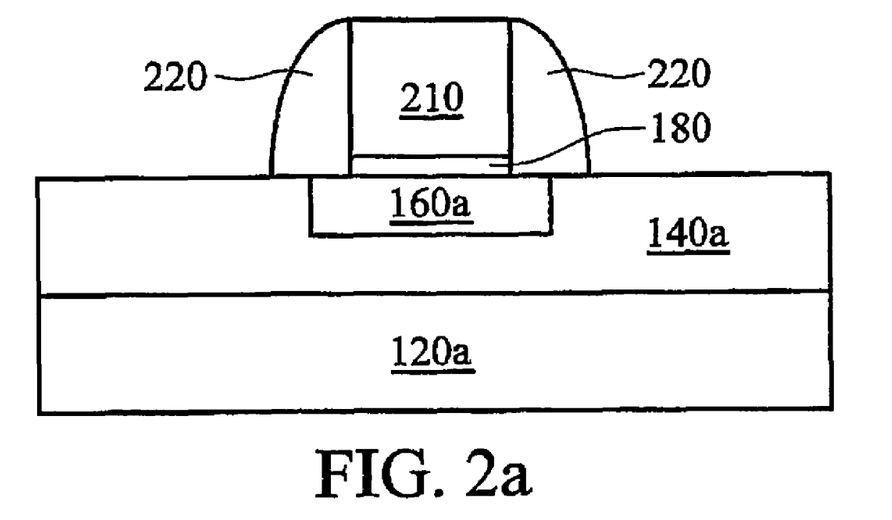
FIGS. 2a and 2b are cross-sectional views of intermediate stages in the manufacture of PMOS devices according to embodiments of the present invention.
Figure 2B:
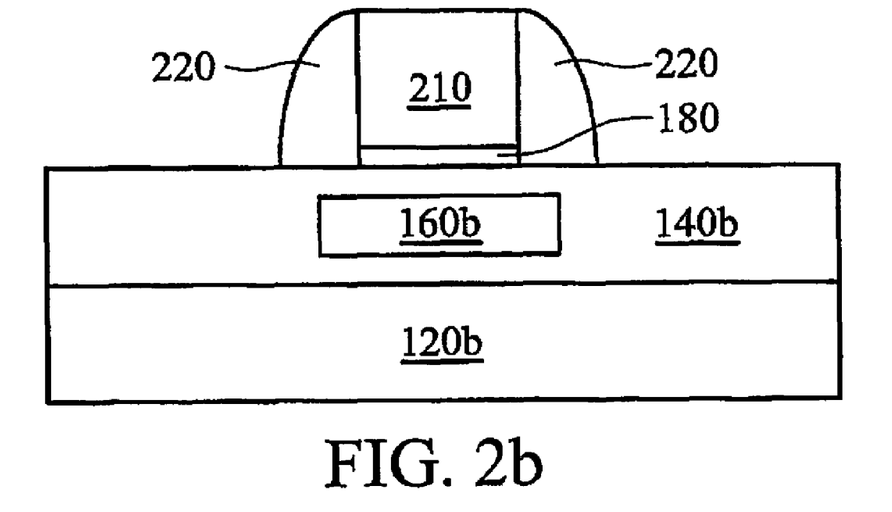

Turning now to FIGS. 2a and 2b, there is shown the intermediate devices of FIGS. 1a and 1b after formation of a gate dielectric 180 and a gate electrode 210, as illustrated in FIGS. 2a and 2b. In the first embodiment, shown in FIG. 2a, the gate dielectric 180 is formed directly on the second layer 160a. In the second embodiment, shown in FIG. 2b, the gate dielectric 180 is formed directly on the first layer 140b. In alternate embodiments, the area of the second layer 160a (or 160b,c) may be less, equal to, or greater than the gate area.

The gate dielectric layer 180 may comprise $SiO_2$, oxynitride, nitride or high-k materials. The gate electrode 210 is preferably polysilicon, although it may be formed of metal or a compound structure of dielectric/metal/semiconductor or other compound structures.

FIGS. 2a and 2b further illustrate a pair of spacers 220 formed along the sidewalls of the gate dielectric 180 and gate electrode 210. Spacers 220 serve as self-aligning masks for subsequent source/drain formation steps, as described below. The spacers 220 may be formed by well-known methods such as blanket depositing a dielectric layer over the entire region, then anisotropically etching to remove the dielectric from the horizontal surfaces and leaving spacers 220.

Figure 3:
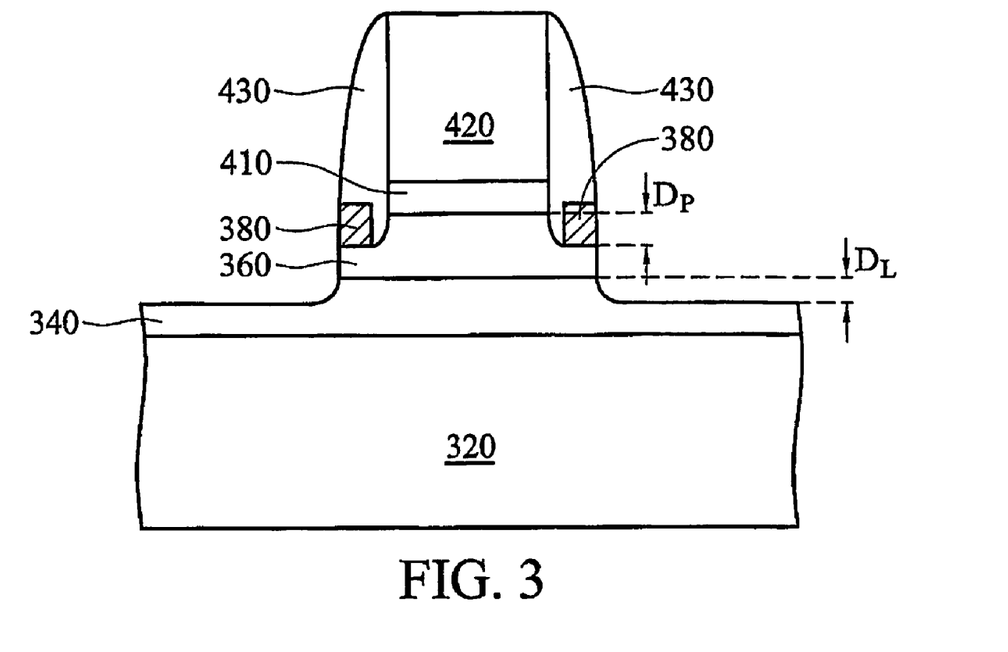
FIG. 3 is a cross-sectional view of intermediate stages in the manufacture of embodiments of the present invention.

Alternative embodiments of the invention that are particularly advantageous in the fabrication of high performance NMOS devices are now described. Turning now to FIG. 3, there is illustrated an embodiment of the invention comprising an NMOS having a preferred tensile strain. The structure in FIG. 3 includes stacked layers 320, 340 and 360. Substrate 320 is preferably a semiconductor. More preferably, substrate 320 is formed of silicon, either a bulk silicon wafer or a layer of silicon formed on an insulating layer such as a buried oxide layer (BOX), in the well-known silicon-on-insulator (SOI) structure.

An optional buffer layer 340 is formed over the substrate 320, preferably epitaxially on the substrate 320. The buffer layer 340 is preferably a semiconductor having a lattice constant greater than or equal to (preferably greater than) the substrate 320. In the preferred embodiment, the buffer layer 340 comprises SiGe. In other embodiments, it comprises materials such as silicon, germanium and carbon. The preferred thickness of the buffer layer 340 is between about 2 nm and about 50 nm.

An optional capping layer 360 is formed epitaxially on the buffer layer 340. The capping layer 360 has a lattice constant of equal to or smaller (preferably smaller) than the lattice constant of the buffer layer 340. Continuing with the embodiment illustrated in FIG. 3, the capping layer 360 comprises silicon. In other embodiments, it comprises materials such as silicon and germanium. The capping layer 360 may comprise SiGe, wherein the Ge fraction in the capping layer 360 is less than in a SiGe buffer layer. The semiconductor-capping layer 360 is also referred to as silicon-capping layer 360 although it may comprise other materials.

The thickness of the capping layer 360 for PMOS is preferably less than NMOS devices. Different capping layer 360 thicknesses can preferably be achieved by two methods: (1) forming the capping layer 360 for both PMOS and NMOS devices, and then reducing the thickness for PMOS devices; or (2) forming the capping layer 360 for both PMOS and NMOS devices to a first thickness, masking the PMOS devices, and further forming the capping layer 360 for the NMOS devices to a second thickness. In regions where PMOS devices are to be formed, the semiconductor-capping layer 360 preferably has a thickness of between about 0.1 nm and 50 nm. In regions where NMOS devices are to be formed, the semiconductor-capping layer 360 preferably has a thickness of between about 0.3 nm and 30 nm.

Continuing with FIG. 3, over the buffer layer 340 and on the capping layer 360, there is preferably formed a stressor 380. The stressor 380 may be deposited by using additional patterning and etching techniques, such as an additional spacer process to define a stressor area.

In preferred embodiments, the stressor 380 has a lattice constant larger than the lattice constant of the capping layer 360. The stressor layer 380 preferably comprises SiGe. A gate dielectric 410 may comprise $SiO_2$, oxynitride, nitride or high-k materials. A gate electrode 420 is preferably poly-silicon, although it may be formed of metal or a compound structure of dielectric/metal/semiconductor or other compound structures.

FIG. 3 further illustrates a pair of spacers 430 formed along the sidewalls of the gate dielectric 410 and the gate electrode 420. The spacers 430 serve as self-aligning masks for subsequent source/drain formation steps, as described below. The spacers 430 may be formed by well-known methods such as blanket depositing a dielectric layer over the entire region, then anisotropically etching to remove the dielectric from the horizontal surfaces and leaving the spacers 430.

Preferably, the spacers 430 extend into the silicon capping layer 360, thereby resulting in a first recess, which is labeled $D_P$ in FIG. 3. Preferably, $D_P$ in the semiconductor capping layer 360 is less than about 40 nm.

In the preferred embodiment illustrated in FIG. 3, the stressor 380 includes a top surface underlying the spacer 430, a sidewall adjacent the spacer 430, and a bottom surface on the capping layer 360. The embodiment of FIG. 3 further includes a capping layer 360 having a first portion underlying the stressor 380, a second portion underlying the spacer 430, and a third portion underling the gate dielectric 410. The capping layer 360 further includes a recess, labeled $D_P$. Preferably, substantially all the first portion of the capping layer and the second portion of the capping layer underlie the recess $D_P$, as shown in FIG. 3.

In an alternative embodiment, a second recess labeled $D_L$, extends from capping layer 360 into buffer layer 340. As shown in the embodiment of FIG. 3, the buffer layer 340 includes a first portion underlying the capping layer 360 and a second portion adjacent the capping layer 360.

Figure 4:
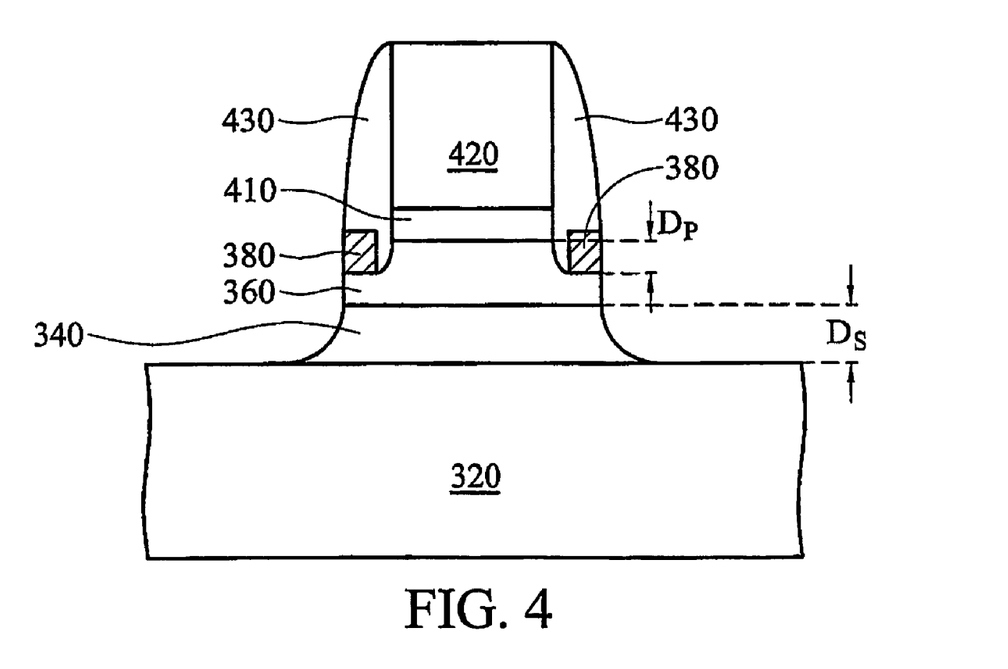
FIGS. 4 through 7 are cross-sectional views of NMOS devices according to alternative embodiments of the present invention.

In another embodiment illustrated in FIG. 4, substantially all the buffer layer 340 underlies the capping layer 360. As shown in FIG. 4, a third recess, labeled $D_S$, extends from the capping layer 360 completely through the buffer layer 340 into the substrate 320.

Figure 5:
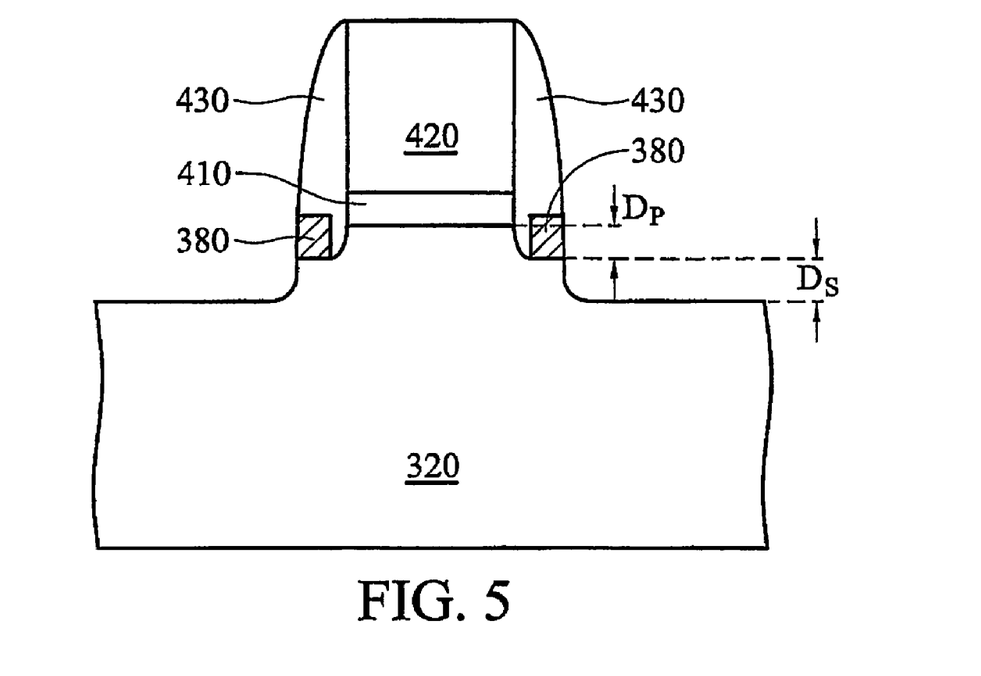
Figure 6:
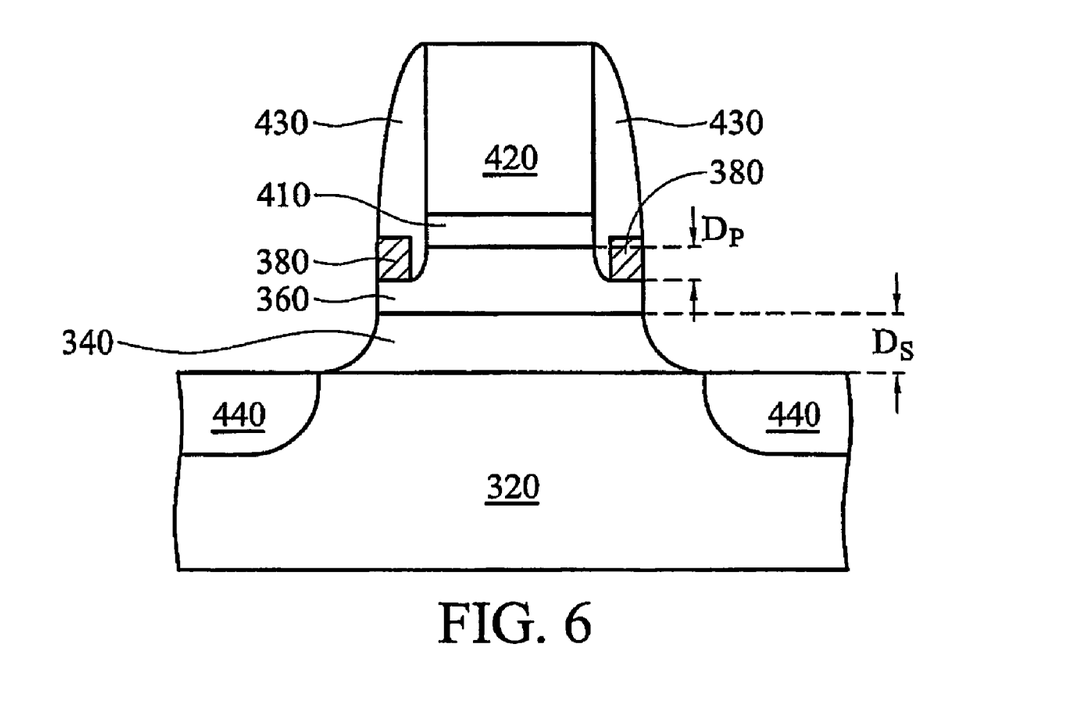

As noted above, buffer layer 340 (FIG. 6) and capping layer 360 (FIG. 6) are optional layers. FIG. 5 illustrates an alternative embodiment not including buffer layer 340 (FIG. 6) and capping layer 360 (FIG. 6). In this embodiment, the stressor 380 includes a top surface underlying the spacer 430, a sidewall adjacent the spacer 430, and a bottom surface on the substrate 320. The embodiment of FIG. 5 further includes a substrate 320 having a first portion underlying the stressor 380, a second portion underlying the spacer 430, and a third portion underling the gate dielectric 410, and a forth portion adjacent the spacer 430. In the embodiment on FIG. 5, the recess $D_P$ is measured from the bottom surface of the stressor 380 to the underside of the gate dielectric 410. The recess $D_S$ is measured from the free surface of the substrate 320, which is adjacent the spacer 430, to the bottom of the stressor 380. The recess depth $D_S$ in the substrate 320 is preferably less than about 80 nm. Tensile strain may also be generated by stressor 380 and buffer layer 340 because these two layers have free surfaces (the recess makes the free surface), thereby inducing relaxation at the edge and further generating tensile strain on device.

Preferably, NMOS devices have recesses extending into the buffer layer 340 (FIG. 6), and PMOS devices have recesses extending into the capping layer 360 (FIG. 6) without further extending into the buffer layer 340 (FIG. 6).

Figure 7:
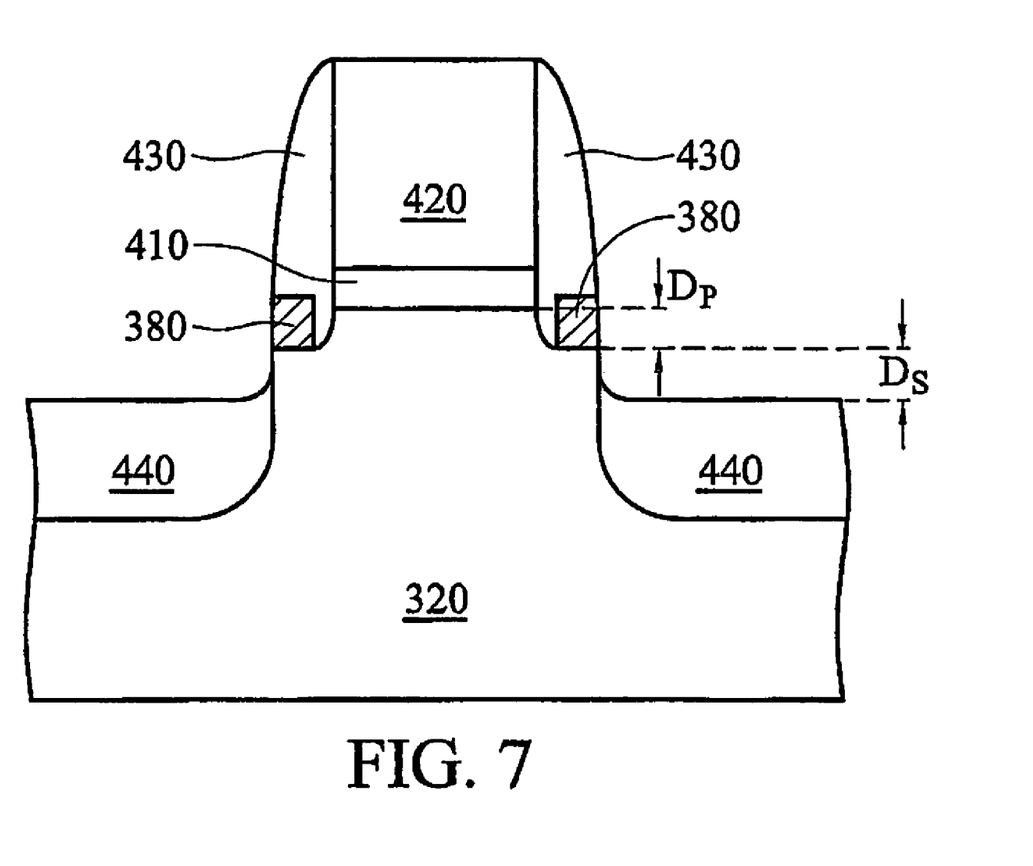

Source and drain regions 440 are then formed, as illustrated in FIG. 6. In a preferred embodiment, the source and drain regions 440 are formed by doping on either side of the spacers 430. FIG. 7 illustrates an alternative embodiment corresponding to FIG. 6, but wherein optional buffer 340 and capping layers 360 are eliminated.

While the embodiments of FIGS. 3-7 were described in terms of a stacked arrangement of layers, a description in terms of a sidewall spacer, wherein the sidewall spacer includes a stressor is equally appropriate. Referring to FIG. 7, for example, embodiments of the invention comprise a method for making MOS devices. Embodiments include forming a substrate 320 having source/drain regions 440, forming an electrode region (comprising an gate electrode 420 and a gate dielectric 410) with a channel region between the source/drain 440 and underlying the electrode region. Embodiments further include forming the stress-inducing spacer 430 adjacent the gate electrode regions, wherein the stress-inducing spacer 430 further includes a stressor 380. Preferably, the stress-inducing spacer creates a stress in the channel region. As illustrated by FIG. 6, the channel region may further include a substrate 320, a buffer layer 340, a capping layer 360, and/or a combination thereof. Preferably, a first portion of the sidewall spacer 430 is adjacent the stressor 380, and a second portion of the sidewall spacer 430 is over the stressor 380. The stressor 380 may be on the substrate 320, the buffer layer 340, or the capping layer 360 in alternative embodiments.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
   a substrate, the substrate comprising a material having a lattice constant greater than or equal to silicon;
   a first layer on the substrate, wherein the first layer comprises a material having a lattice constant greater than the substrate;
   a gate above the first layer, the gate comprising a gate electrode and a gate dielectric underlying the gate electrode;
   a spacer, the spacer formed on a sidewall of the gate electrode, a sidewall of the gate dielectric, and a portion of a top surface of the first layer; and
   a second layer formed on the first layer, the second layer comprising a top surface, a bottom surface, and a lateral surface connecting the top surface and the bottom surface, the second layer further comprising a material having a lattice constant less than the first layer, wherein the second layer underlies the gate electrode and at least a portion of the spacer, and wherein the top, bottom, and lateral surfaces of the second layer contact the first layer whereby the first layer fully encapsulates the second layer.

2. The semiconductor device of claim 1, wherein the first layer comprises a material selected from the group consisting essentially of silicon, germanium, carbon, and combinations thereof.

3. The semiconductor device of claim 1, wherein the semiconductor device comprises a PMOS transistor.

4. The semiconductor device of claim 1, wherein the semiconductor device comprises a NMOS transistor.

5. A semiconductor device comprising:
   a substrate having a lattice constant;
   a buffer layer on the substrate, wherein the buffer layer has a lattice constant greater than or equal to the substrate lattice constant;
   a capping layer on the substrate, wherein the capping layer has a lattice constant less than or equal to the buffer layer lattice constant;
   a gate on the capping layer, wherein the gate includes a gate dielectric on the capping layer, and a gate electrode on the gate dielectric;
   a spacer formed on a sidewall of the gate electrode, on a sidewall of the gate dielectric, and within a recess in the capping layer;
   a stressor formed within a portion of the spacer within the recess in the capping layer, wherein the stressor includes a semiconductor material having a lattice constant greater than the substrate lattice constant; and
   a source/drain region substantially aligned with the spacer.

6. The semiconductor device of claim 5, wherein the capping layer comprises a material selected from the group consisting essentially of silicon, germanium, carbon, and combinations thereof.

7. The semiconductor device of claim 5, wherein the buffer layer comprises a material selected from the group consisting essentially of silicon, germanium, carbon, and combinations thereof.

8. The semiconductor device of claim 5, wherein the stressor comprises a material selected from the group consisting essentially of silicon, germanium, carbon, and combinations thereof.

9. The semiconductor device of claim 5, wherein the MOS device comprises a PMOS transistor or a NMOS transistor.

10. The semiconductor device of claim 5, wherein the recess in the capping layer is less than or equal to about 40 nm.

11. The semiconductor device of claim 5, wherein the buffer layer further comprises a first buffer layer portion having a first buffer thickness and a second buffer layer portion having a second buffer thickness, wherein the second buffer thickness is less than or equal to the first buffer thickness, and wherein the first buffer layer portion underlies the gate and the spacer and is adjacent to the second buffer layer, and the second buffer layer portion both underlies and is adjacent to the gate and the spacer.

12. The semiconductor device of claim 11, wherein a difference between the first buffer thickness and the second buffer thickness is less than about 80 nm.

13. The semiconductor device of claim 5, wherein the capping layer further comprises a first capping layer portion having a first capping thickness and a second capping layer portion having a second capping thickness, wherein the second capping thickness is less than or equal to the first capping thickness, and wherein the first capping layer portion underlies the gate and the second capping layer portion underlies the stressor.

14. The semiconductor device of claim 13, wherein a difference between the first capping thickness and the second capping thickness is less than about 40 nm.

15. A semiconductor device comprising:
- a substrate having a lattice constant;
- a gate on the substrate, wherein the gate includes a gate dielectric on the substrate, and a gate electrode on the gate dielectric;
- a spacer formed on a sidewall of the gate electrode, on a sidewall of the gate dielectric, and within a recess in the substrate; and
- a stressor formed within a portion of the spacer within the recess in the substrate, wherein the stressor includes a semiconductor material having a lattice constant greater than the substrate lattice constant.

16. The semiconductor device of claim 15, wherein the recess within the substrate is less than or equal to about 40 nm.

17. The semiconductor device of claim 15, wherein the stressor comprises a material selected from the group consisting essentially of silicon, germanium, carbon, and combinations thereof.

18. The semiconductor device of claim 15, wherein the semiconductor device comprises a PMOS transistor or a NMOS transistor.

19. The semiconductor device of claim 15, wherein the substrate further comprises a first substrate portion having a first substrate thickness and a second substrate portion having a second substrate thickness, wherein the second substrate thickness is less than or equal to the first substrate thickness, and wherein the first substrate portion underlies the gate and the spacer and is adjacent to the second substrate portion, and the second substrate portion both underlies and is adjacent to the gate and the spacer.

20. The semiconductor device of claim 19, wherein a difference between the first substrate thickness and the second substrate thickness is less than about 80 nm.

21. The semiconductor device of claim 19, further comprising a buffer layer interposed between the first substrate portion and the gate and the spacer.

22. The semiconductor device of claim 21, further comprising a capping layer interposed between the buffer layer and the gate and the spacer.

* * * * *